United States Patent

Smith

[11] Patent Number: 5,903,419
[45] Date of Patent: May 11, 1999

[54] CIRCUIT FOR ELECTROSTATIC DISCHARGE (ESD) PROTECTION

[75] Inventor: Jeremy C. Smith, Austin, Tex.

[73] Assignee: Motorola, Inc., Schaumburg, Ill.

[21] Appl. No.: 08/939,637

[22] Filed: Sep. 29, 1997

[51] Int. Cl.$^6$ ..................................................... H02H 9/00
[52] U.S. Cl. ............................................. 361/56; 361/111
[58] Field of Search ................................ 361/18, 56, 111, 361/91, 119

[56] References Cited

U.S. PATENT DOCUMENTS

| | | | |
|---|---|---|---|
| 5,311,391 | 5/1994 | Dungan et al. | 361/56 |
| 5,500,546 | 3/1996 | Marum et al. | 257/358 |
| 5,530,612 | 6/1996 | Maloney | 361/56 |
| 5,539,327 | 7/1996 | Shigehara et al. | 326/30 |

OTHER PUBLICATIONS

Naresh Tandan, "ESD Trigger Circuit", EOS/ESD Symposium, Section 3.3.1–3.3.5 (1994). No Month.

Voldman, et al., "Analysis of Snubber–Clamped Diode––String Mixed Voltage Interface ESD Protection Network for Advanced Microprocessors", EOS/ESD Symposium, pp. 43–61 (1995). No Month.

Amerasekera, et al., "Substrate Triggering and Salicide Effects on ESD Performance and Protection Circuit Design in Deep Submicron CMOS Processes", IEDM, pp. 547–550 (1995). No Month.

Ramaswamy, et al., "EOS/ESD Analysis of High–Density Logic Chips", EOS/ESD Symposium, pp. 285–290 (1996).

*Primary Examiner*—Ronald W. Leja
*Attorney, Agent, or Firm*—Lee E. Chastain

[57] ABSTRACT

An electrostatic discharge (ESD) circuit (12) provides robust protection to an input/output driver circuit (10). The discharge path is provided by a parasitic bipolar transistor (202). The parasitic bipolar device is triggered by a combination of a MOSFET (204) and a string of diodes (200). The trigger point of the MOSFET is programmable by varying the number of individual diodes in the string of diodes. A feedback circuit (602) ensures that MOSFET (204) is in a conductive state independent of the voltage state of the voltage supply, VDD, during an ESD event.

16 Claims, 5 Drawing Sheets

CIRCUIT FOR ELECTROSTATIC DISCHARGE (ESD) PROTECTION

RELATED APPLICATIONS

The following specification is one in a group of three applications, filed contemporaneously, and assigned to a common assignee: CIRCUIT FOR ELECTROSTATIC DISCHARGE (ESD) PROTECTION, Ser. No. 08/939,764, CIRCUIT FOR ELECTROSTATIC DISCHARGE (ESD) PROTECTION, Ser. No. 08/939,634, and SEGMENTED BUS ARCHITECTURE (SBA) FOR ELECTROSTATIC DISCHARGE (ESD) PROTECTION, Ser. No. 08/939,284.

The following specification is related by subject matter and by common assignee to the filed application for U.S. Patent: CIRCUIT FOR ELECTROSTATIC DISCHARGE (ESD) PROTECTION, filed Feb. 12, 1997, Ser. No. 08/801, 874, now U.S. Pat. No. 5,843,525.

FIELD OF THE INVENTION

The present invention generally relates to electronic integrated circuits, and more specifically to an electrostatic discharge protection circuit for an integrated circuit.

BACKGROUND OF THE INVENTION

In the semiconductor industry, the use of electrostatic discharge protection (ESD) circuits is known. ESD circuits ensure that integrated semiconductor devices are not destroyed by static electricity during routine post-manufacture processes. However, current and foreseeable trends in the semiconductor industry are adversely impacting the effectiveness of known ESD circuits.

For instance, the use of heavily doped epitaxial (epi) substrates prevents metal oxide semiconductor (MOS) field effect transistors (FETs) and thick field oxide (TFO) devices from acting as current shunting devices. In normal, use, a heavily doped substrate is desirable. Such a substrate reduces the undesirable occurrence of "latch-up." During latch-up, two parasitic bipolar transistors formed by two complimentary MOSFETs create a feedback loop. In the feedback loop, the base of the first parasitic bipolar device is also the collector of the second device. Conversely, the base of the second device is the collector of the first device. When both of these transistors are conducting, large amounts of current can flow between two power supplies. A high current event applied to one of the terminals of the two transistors can cause the two parasitic transistors to conduct. A heavily doped epitaxial substrate acts to break the feedback loop by grounding the substrate and, hence, the base of one device and the collector of the other.

The use of salicide bonding layers to reduce sheet resistivity (rho) also decreases the effectiveness of known ESD circuits. Here, several MOSFETs or several fingers forming a single MOSFET act as a parasitic bipolar device to provide ESD protection. Such an ESD device relies upon the "snap-back" current-voltage characteristics of a parasitic bipolar transistor. There, a current begins to flow through a bipolar transistor at a certain collector-to-emitter voltage, $V_{t1}$. Thereafter, the collector-to-emitter voltage decreases as the current increases, "snapping-back" from $V_{t1}$. Later, the trend reverses, causing the collector-to-emitter voltage to rise as the current also rises. Eventually, the bipolar transistor fails at another particular collector-to-emitter voltage, $V_{t2}$. The low resistance of the salicide layer can cause the ultimate breakdown voltage, $V_{t2}$ to be lower than the initial voltage, $V_{t1}$. Such a relationship causes the first MOSFET or first finger of the MOSFET to breakdown at a voltage less than the voltage at which the second MOSFET turns on. Consequently, the protection provided by the group of MOSFETs is no greater than the protection provided by a single MOSFET.

Some known ESD circuits rely on the inherent capacitance between the voltage rails of a integrated circuit to shunt excess energy applied to one voltage rail to the other. This strategy minimizes the total number of devices necessary to provide protection. However, this strategy also fails as the capacitance of the integrated circuit drops. Consequently, one ESD circuit designed for a particular integrated circuit may not be sufficient for another circuit.

Die reduction is one of the overriding trends in the semiconductor industry. As integrated circuits shrink, the area allocated to ESD circuits shrinks. Typically, an ESD circuit is placed below an input, output, or I/O pin which the circuit protects. This area is rapidly becoming inadequate to host such circuits.

Other known ESD circuits rely on diode strings to shunt power. Unfortunately, these diode strings leak current at elevated temperatures. Furthermore, each diode's leakage increases with its temperature. Another trend in the semiconductor industry is to design and manufacture integrated circuits that consume as little current as possible and that are suitable for wide usage. Both of these goals is adversely impacted by leaky designs that are limited by environmental concerns.

BRIEF DESCRIPTION OF THE DRAWINGS

The features and advantages of the present invention will be more clearly understood from the following detailed description taken in conjunction with the accompanying FIGURES where like numerals refer to like and corresponding parts and which.

DETAILED DESCRIPTION OF THE INVENTION

Figure 1:
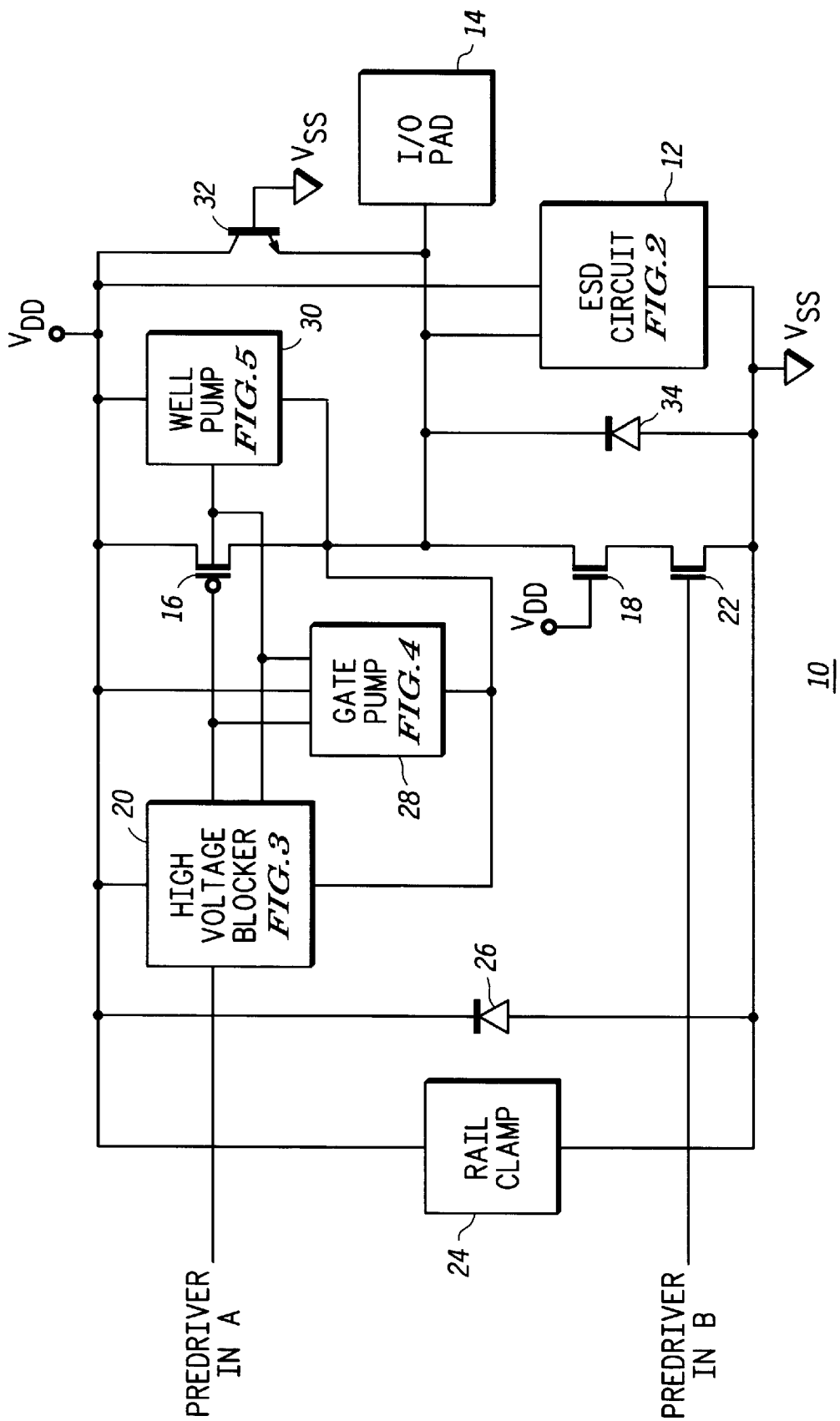
FIG. 1 depicts a partial block diagram partial schematic diagram of an input/output driver circuit constructed according to the present invention.

FIG. 1 depicts a partial block diagram, partial schematic diagram of an input/output (I/O) driver circuit 10 constructed according to the present invention. I/O driver circuit 10 includes an ESD circuit 12 to provide protection against electrostatic discharge events and against electrical over-stress (EOS) events. ESD circuit 12 uses a MOSFET to supply trigger to a parasitic bipolar transistor. Consequently, ESD circuit 12 may be incorporated into semiconductor processes which use heavily doped epitaxial substrates or salicided bonding layers, or which have low total chip capacitance. ESD circuit 12 is more fully described below in connection with FIG. 2.

For purposes of more clearly illustrating the invention, the discussion is structured according to the following Table of Contents. No particular limitation should be accorded to any heading or classification:

I. Introduction
II. I/O Driver Circuit
  A. Connectivity
  B. Operation
    1. Normal Operation
    2. ESD Events
      a. Positive Voltage Input With Respect to VDD
      b. Positive Voltage Input With Respect to VSS
      c. Negative Input Voltage With Respect to VDD
      d. Negative Voltage Input With Respect to VSS
  C. First embodiment of ESD circuit
    1. Connectivity
    2. Alternate Embodiments
    3. Operation
  D. High Voltage Blocker
  E. Gate Pump
  F. Well Pump
  G. Second embodiment of ESD circuit
    1. Connectivity
    2. Operation
      a. Normal Operation
      b. ESD Events
  H. Third embodiment of ESD circuit
    1. Connectivity
    2. Operation
      a. Normal Operation
      b. ESD Events
III. Segmented Bus Architecture
  A. Connectivity
  B. I/O Pad Cell
  C. Operation
    1. Normal Operation
    2. ESD Events
      a. Positive Voltage Input With Respect to VDD
      b. Positive Voltage Input With Respect to VSS
      c. Negative Input Voltage With Respect to VDD
      d. Negative Voltage Input With Respect to VSS I. Introduction At this point, it is appropriate to note that ESD circuit 12 uses a MOSFET transistor to trigger a parasitic bipolar transistor that shunts excess energy. The use of a trigger current lowers the point at which the parasitic bipolar transistor begins to shunt energy. The use of a parasitic bipolar transistor eliminates the need for a true bipolar device. A true bipolar transistor is one who's control electrode is separate from the semiconductor substrate and, hence, is directly controllable. Typically, the inclusion of a bipolar device significantly increases the manufacturing costs of the integrated circuit. The direct application of the trigger current to the control electrode of the parasitic bipolar transistor locally overcomes the voltage potential caused by a heavily doped substrate. Normally, the substrate is coupled to the lesser of two voltage supplies. The trigger point is easily programmable by increasing or decreasing the number of diodes in a diode string. However, it is the parasitic bipolar device that shunts the majority of the excess energy, not the diode string. Consequently, the individual diodes may be made very small to minimize current leakage and temperature induced performance variations. Also, ESD circuit 12 does not rely on the capacitance between the two voltage rails. Therefore, ESD circuit 12 may be incorporated into small integrated circuits, into large integrated circuits, and into standard cell libraries used throughout a design organization. One skilled in the art will readily appreciate the suitability of ESD circuit 12 to current and future integrated circuit process flows.

II. I/O Driver Circuit

A. Connectivity

Continuing with FIG. 1 an input/output (I/O) pad 14 generates a voltage level that is transmitted to another device external to the integrated circuit incorporating I/O driver circuit 10. In the current embodiment, I/O driver circuit 10 outputs 0 or 3.3 Volts on I/O pad 14. In other embodiments I/O driver circuit 10 may include circuitry to receive voltage levels from other devices external to the integrated circuit incorporating I/O driver circuit 10. In such embodiments, the voltages may also be 0 or 3.3 Volts. Still, in other o S embodiments, the maximum received voltage level may exceed the maximum output Voltage level. For instance, I/O driver circuit 10 may output either 0 or 3.3 Volt signals but may receive 0 or 5 Volt signals.

I/O pad 14 is connected to a first current electrode of a p-type MOSFET transistor 16 and to a first current electrode of an n-type MOSFET transistor 18. A second current electrode and a control electrode of transistor 16 is coupled to a first voltage supply, VDD, and to an output terminal of a high voltage blocker 20, respectively. High voltage blocker 20 receives four inputs, PREDRIVER IN A, VDD, I/O pad 14, and the well of transistor 16. High voltage blocker 20 is described below in connection with FIG. 3.

A second current electrode and a control electrode of transistor 18 is coupled to a first current electrode of an n-type MOSFET transistor 22 and to a first voltage supply, VDD, respectively. A second current electrode and a control electrode of transistor 22 is coupled to a second voltage supply, VSS, and to an input PREDRIVER IN B, respectively.

I/O driver circuit 10 also includes a rail clamp 24 and a diode 26 coupled in parallel between VDD and VSS. Rail clamp 24 may be the inherent a capacitance of the integrated circuit incorporating I/O driver circuit 10, if sufficient, or may be an active circuit that provides a discharge path between VDD and VSS during an ESD event. Rail clamp 24 may be shared by several I/O pads. Diode 26 is coupled such that it conducts current when VSS is approximately 0.5 Volts higher than VDD. Normally, VDD is 3.3 Volts higher than VSS. Four terminals of a gate pump 28 are coupled to VDD, to the control electrode of a transistor 16, to I/O pad 14, and to the well of transistor 16, respectively. Gate pump 28 is described below in connection with FIG. 40 Three terminals of a well pump 30 are coupled to VDD to the well of a transistor 16, and to I/O pad 14, respectively. Well pump 30 is described below in connection with FIG. 5. A first current electrode, a second current electrode, and a control electrode of an npn bipolar transistor 32 is coupled to VDD, to I/O pad 14, and to VSS respectively. A first terminal and a second terminal of a diode 34 is coupled to a I/O pad 14 and to VSS, respectively. Diode 34 is coupled such that it conducts current when VSS is approximately 0.5 Volts higher than the voltage present on I/O pad 14. Normally, the voltage level present on I/O pad 14 is greater than or equal to VSS.

II. I/O Driver Circuit 10

B. Operation

The operation of I/O driver circuit 10 may be conveniently described with reference to two modes of operation: (1) normal I/O operation, and (2) electrostatic discharge protection. The electrostatic discharge protection function may be further divided into four cases paralleling the four methods used to test the human body model: (1) positive input voltage with respect to VDD, (2) positive input voltage with respect to VSS, (3) negative input voltage with respect to VDD, and (4) negative input voltage with respect to VSS.

1. Normal Operation

In normal operation, I/O driver circuit 10 is either used as an output only or an input only driver. The particular function is selected by the logic state of control signals PREDRIVER IN A and PREDRIVER IN B. If I/O driver circuit 10 is to be used as an output only buffer, then the signal to be output (generated elsewhere) is applied to both the control electrode of transistor 16 and to the control electrode of transistor 22. The signal to be output is applied to the control electrode of transistor 16 via high voltage blocker 20. Thus, PREDRIVER IN A and PREDRIVER IN B are both at the potential of the desired output signal. Depending upon which transistor is enabled, either voltage supply VDD or voltage supply VSS will be coupled to I/O pad 14. If I/O driver circuit 10 is used as an input only buffer, then PREDRIVER IN A is set to VDD and PREDRIVER IN B is set to VSS. These voltage levels place I/O pad 14 into a high impedance state. In this case, a voltage generated external to I/O driver circuit 10 is applied to I/O pad 14 and buffered by circuitry (not shown).

As described above, I/O driver circuit 10 is 5 volt tolerant. If a 5 Volt signal is applied to I/O pad 14, then no damage will occur. The control electrode and the well of transistor 16 are both biased with the higher input voltage level by gate pump 28 and by well pump 30, respectively. This bias ensures that transistor 16 does not conduct current when a voltage greater than voltage supply VDD is applied to I/O pad 14. Furthermore, high voltage blocker 20 ensures that the bias voltage applied to the control electrode of transistor 16 is not applied to internal circuitry (not shown).

2. ESD Events a. Positive Voltage Input With Respect to VDD

In this case, a large positive voltage level is applied to I/O pad 14 with respect to voltage supply VDD. The large positive input voltage causes ESD circuit 12 to shunt energy from I/O pad 14 to VSS, which is floating in this scenario. The voltage on voltage supply VSS begins to rise, forward biasing diode 26. ESD circuit 12, voltage supply VSS, and diode 26 thereby form a discharge path from I/O pad 14 to voltage supply VDD.

b. Positive Voltage Input With Respect to VSS

In this case, a large positive voltage level is applied to I/O pad 14 with respect to voltage supply Input. Again, the large positive input voltage causes ESD circuit 12 to shunt energy from I/O pad 14 to VSS. ESD circuit 12 thereby forms a discharge path from I/O pad 14 to voltage supply VSS.

c. Negative pnput Voltage With Respect to VDD

Here, a large negative voltage level is applied to I/O pad 14 with respect to voltage level VDD. This large negative voltage forward biases diode 34 and allows rail clamp 24 to couple the voltage supply VSS to the voltage supply VDD.

Diode 34 and rail clamp 24 form a discharge path from the voltage supply VDD to I/O pad 14. Again, rail clamp 24 may be the inherent capacitance of the integrated circuit incorporating I/O driver circuit 10 or may be an active clamp circuit. There is also a secondary shunt path from the voltage supply VDD to I/O pad 14 via transistor 32. In this secondary case, the inherent capacitance (or rail clamp 24) couples VDD to VSS and ultimately to the control electrode of transistor 32. Transistor 32 is then forward biased causing current to flow from the voltage supply VDD, through transistor 32, to I/O pad 14.

d. Negative Voltage Input With Respect to VSS

In this case, a large negative voltage is applied to I/O pad 14 with respect to voltage supply VSS. Here, diode 34 becomes forward biased, shunting energy from the voltage supply VSS to I/O pad 14. There is also a secondary shunt path from the voltage supply VSS to I/O pad 14 via transistor 32. In this secondary case, the control electrode-to-second current electrode junction of transistor 32 is forward biased, creating a direct current path from voltage supply VSS to I/O pad 14. As depicted in FIG. 1, the voltage supply VSS is coupled to the control electrode of transistor 32.

II. I/O Driver Circuit

C. First embodiment of ESD circuit

1. Connectivity

Figure 2:
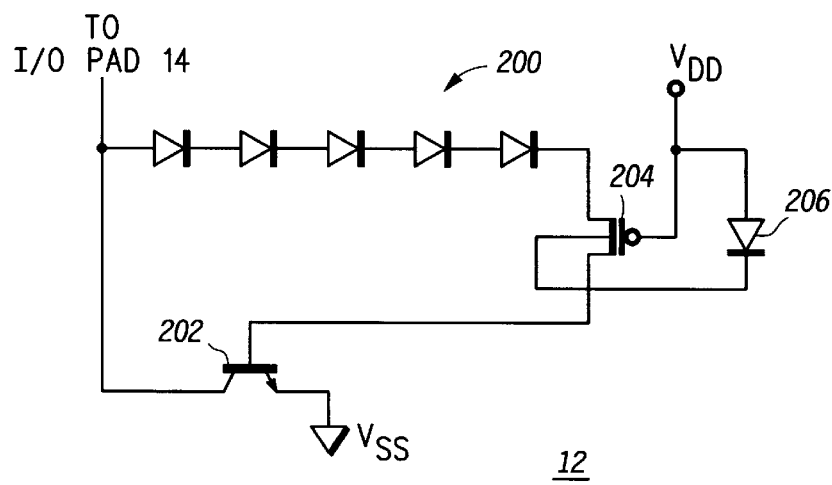
FIG. 2 depicts a circuit diagram of a first embodiment of the ESD circuit illustrated in FIG. 1.

FIG. 2 depicts a circuit diagram of a first embodiment of the ESD circuit illustrated in FIG. 1. Each of a first terminal of a string of serially connected diodes 200 and a first current electrode of a parasitic npn bipolar transistor 202 is coupled to I/O pad 14. A second terminal of a string of diodes 200 is coupled to a first current electrode of a p-type MOSFET transistor 204. In the depicted embodiment, the string of diodes 200 contains five diodes. A second current electrode and a control electrode of transistor 202 is coupled to the voltage supply VSS and to a second current electrode of transistor 204, respectively. A control electrode of transistor 204 is coupled to a first terminal of a diode 206 and to the voltage supply VDD. A second terminal of diode 206 is coupled to the well of transistor 204.

The individual diodes in string of diodes 200 are connected such that an they conduct current when the voltage level present on 1O pad 14 exceeds the sum of, approximately, (5*0.5) Volts plus a threshold voltage level of transistor 204 plus the control electrode voltage of transistor 204 (VDD). Diode 206 is connected such that it prevents the flow of current from string of diodes 200 through the n-well of transistor 204 to voltage supply VDD. This path is of concern when a large positive voltage is applied to I/O pad 14 with respect to the voltage supply VDD. Instead, diode 206 forces current to flow through transistor 202.

2. Alternate Embodiments

As described above, transistor 202 is fabricated by a CMOS manufacturing process. Consequently, transistor 202 may be a MOSFET or simply a thick field oxide (TFO) device. This aspect of the present invention allows the invention to be incorporated into standard CMOS processes.

If transistor 202 is a MOSET, then there are several possible configurations which will cause transistor 202 to efficiently act as a parasitic lateral bipolar device. For instance, the gate of transistor 202 need not be used to generate a channel between its two current electrodes. Instead, trigger current generated by transistor 204 is injected directly into the body of transistor 2020 Therefore, the insulated gate of a MOSFET may be tied to a voltage supply and a contact to the body of transistor 202 may be placed adjacent to its two current electrodes. In the depicted embodiment, the substrate is a p-type substrate and the contact is a p+-type implant or diffusion region. The source and drain are manufactured by diffusing or implanting two n-type regions into the p-type substrate and forming n-type contacts thereon. The contact to provide trigger current to the body of transistor 202 may be placed such that (1) the source (or drain) is between the contact and the drain (or source), or (2) the contact encloses the source and drain when viewed from above like a ring or thin rectangle.

One skilled in the art will readily appreciate that a reference to the body of a transistor herein is equivalent to a reference to its well or a reference to its local substrate in the absence of a well.

If transistor 202 is a TFO device, then the contact to the transistor body may be located between its source and drain, may be located beside either source or drain, or may surround the source and drain. TFO devices consist of two diffusion regions of similar conductivity type, in close proximity to each other, and disposed in a semiconductor body of opposite conductivity type. Typically, two n-type regions are disposed in a p-type substrate. A thick oxide layer forms on top of the substrate in the areas between like or opposite diffused or implanted regions.

Silicon-on-insulator (SOI) is an emerging technology in which semiconductors are manufactured on insulating substrates such as silicon dioxide, sapphire, diamond, etc. The present invention may be embodied into such a technology with similar benefits. In such a technology, a contact to supply trigger current may be formed laterally to the body of transistor 202.

II. I/O Driver Circuit 10

C. First embodiment of ESD circuit

3. Operation

The operation of ESD circuit 12 may be conveniently described with reference to two possible events: (1) electrostatic discharge (ESD) events, and (2) electrical overstress (EOS) events. Generally, ESD events are shorter than EOS events and typically occur when the integrated circuit is not powered.

As described above in connection with FIG. 1, ESD circuit 12 provides ESD protection in two cases: (1) positive input voltage with respect to VDD, and (2) positive input voltage with respect to VSS. In the first case, transistor 204 begins supplying a trigger current to transistor 202 when the voltage of I/O pad 14 exceeds the sum of, approximately, (5*0.5) Volts plus a threshold voltage level of transistor 204. A short time thereafter, transistor 202 shunts current from I/O pad 14 to the voltage supply VSS. Diode 26 (FIG. 1) completes the circuit path to the voltage supply VDD. In the second case, transistor 204 also begins supplying a trigger current to transistor 202 when the voltage of I/O pad 14 exceeds the sum of, approximately, (5*0.5) Volts plus a threshold voltage level of transistor 204. A short time thereafter, transistor 202 directly shunts current from I/O pad 14 to the voltage supply VSS.

The operation of ESD circuit 12 during an EOS event is similar to its operation in an ESD event. Here, transistor 204 begins supplying a trigger current to transistor 202 when the voltage of I/O pad 14 exceeds the sum of, approximately, (5*0.5) Volts plus a threshold voltage level of transistor 204 plus the control electrode voltage of transistor 204 (VDD).

The number of individual diodes in string of diodes 200 is determined as by the difference between the minimum allowable voltage supply level of VDD and the maximum allowable specified input voltage on I/O pad 14 divided by the voltage drop across each diode. Typically these values are 10% less and 10% greater than the nominal values of VDD and of the input voltage, respectively. In the described embodiment, VDD is 3.3 Volts and the maximum tolerable input voltage is 5.0 Volts. Therefore, five diodes (5.5–3.0)/ (0.5) were selected.

In another embodiment of ESD circuit 12, diode 206 is omitted. In this case, transistor 204 has characteristics of a parasitic vertical and a parasitic lateral pnp-type bipolar transistor. These characteristics generate a base current that raises the local substrate potential of transistor 202 if transistor 204 is in close physical proximity to transistor 202. This additional base current further triggers transistor 202. In still other embodiments, diode 206 may be replaced with a resistor or a direct electrical connection.

In the preferred embodiment, transistor 202 is fabricated by placing two n-type diffusions into a p-type substrate. Furthermore, both, one or neither of these diffusions may be shrouded with n-type wells. These diffusions form the first and second current electrodes. A p-type contact is located between the two n-type wells. The p-type contact to the p-type substrate forms the control electrode. This basic design may be tiled to increase the total width of transistor 202 without unnecessarily consuming space on the integrated circuit. Also, it is customary to periodically tie the p-type substrate to the voltage supply VSS. These ties should not be placed adjacent to transistor 202. Otherwise, the substrate lifting effect provided by the trigger current will be abated.

II. I/O Driver Circuit 10

D. High Voltage Blocker

Figures 3, 4:
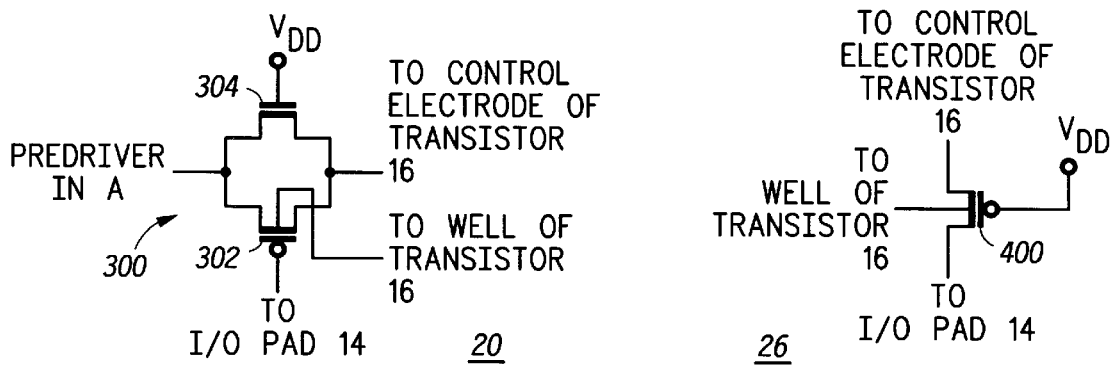
FIG. 3 depicts a circuit diagram of a high voltage blocker 10 illustrated in FIG. 1.
FIG. 4 depicts a circuit diagram of a gate pump illustrated in FIG. 1.

FIG. 3 depicts a circuit diagram of high voltage blocker 20 illustrated in FIG. 1. High voltage blocker 20 comprises a transmission gate 300 itself consisting of a p-type MOSFET transistor 302 and an n-type MOSFET transistor 304. A control electrode of transistor 302 is coupled to I/O pad 14. A control electrode of transistor 304 is coupled to the voltage supply VDD. A first current electrode of transistors 302 and 304 receive the signal PREDRIVER IN A. A second current electrode of transistors 302 and 304 are coupled to the control electrode of transistor 16. The body of transistor 302 is also connected to the well of transistor 16.

When a high voltage signal is applied to I/O pad 14, the n-type device in transmission gate 300 limits the voltage passed from I/O pad 14 to internal circuitry (not shown) to (3.3-Vtn) Volts, where Vtn is the threshold voltage of transistor 304 (transistor 302 is off in this state). Transistor 302 and transistor 304 allow a signal to be passed from PREDRIVER A to the control electrode of transistor 16 without attenuation.

II. I/O Driver Circuit 10

E. Gate Pump

FIG. 4 depicts a circuit diagram of gate pump 28 illustrated in FIG. 1. Gate pump 28 comprises a p-type MOSFET transistor 400. A first current electrode, a second current electrode, and a control electrode of transistor 400 is coupled to the control electrode of transistor 16, to I/O pad 14, and to the voltage supply VDD, respectively. The body of transistor 400 is also connected to the well of transistor 16.

II. I/O Driver Circuit 10

F. Well Pump

Figure 5:
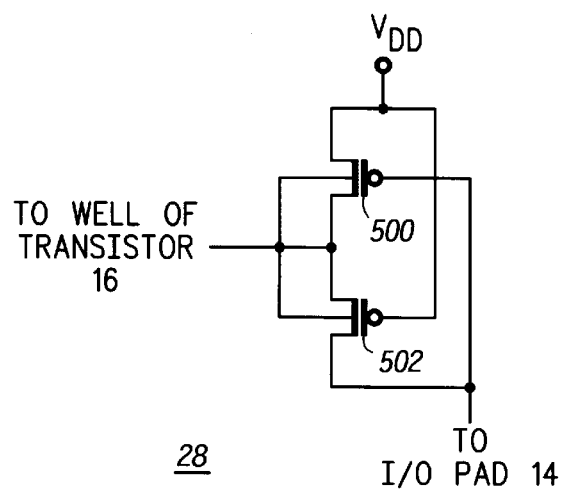
FIG. 5 depicts a circuit diagram of a well pump illustrated in FIG. 1.

FIG. 5 depicts a circuit diagram of well pump 30 illustrated in FIG. 1. Well pump 30 comprises two p-type MOSFETs 500 and 502. A first current electrode, a second current electrode, and a control electrode of transistor 500 is coupled to the voltage supply VDD, to the well of transistor 16, and to I/O pad 14, respectively. A first current electrode, a second current electrode, and a control electrode of transistor 502 is coupled to the well of transistor 16, to I/O pad 14, and to the voltage supply VDD, respectively. The bodies of transistors 500 and 502 are also connected to the well of transistor 16.

In operation, transistors 500 and 502 adjust the well of transistor 16 when the voltage level present on I/O pad 14 exceeds the voltage supply VDD. Specifically, when the voltage level present on I/O pad 14 initially exceeds the voltage supply VDD, then transistor 502 allows the well of transistor 16 to track the increased voltage level. This strategy prevents the drain diode of transistor 16 from forward biasing. Conversely, when the voltage level present on I/O pad 14 returns to VDD or VSS then transistor 500 restores the well to its initial value, VDD by releasing charge to the voltage supply VDD.

II. I/O Driver Circuit 10

G. Second embodiment of ESD circuit
1. Connectivity

Figure 6:
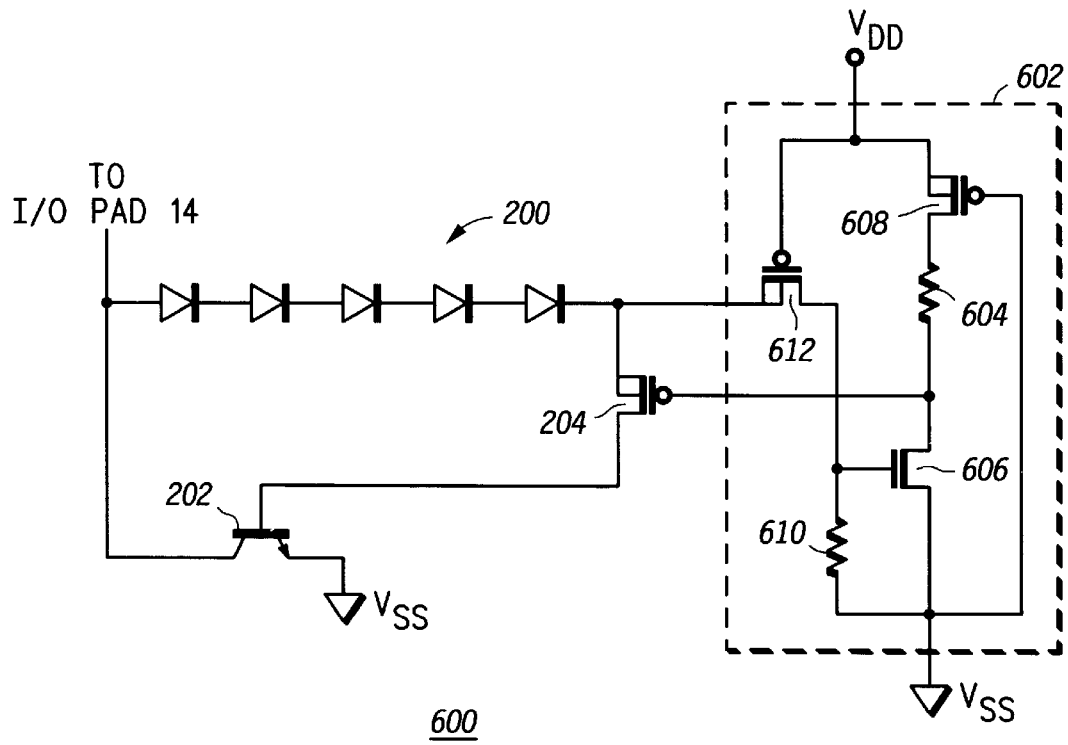
FIG. 6 depicts a circuit diagram of a second embodiment of the ESD circuit illustrated in FIG 1.

FIG. 6 depicts a circuit diagram of a second embodiment 600 of the ESD circuit illustrated in FIG. 1. In the second embodiment of the present invention, a feedback or switching circuit 602 is coupled to transistor 204. During an ESD event, feedback circuit 602 maintains transistor 204 in a conductive state. Therefore, transistor 204 supplies a trigger current to transistor 202 and transistor 202 shunts current from I/O pad 14 to the voltage supply, VSS. During normal operation, feedback circuit 602 places transistor 204 into a non-conductive state to minimize current leakage.

During an ESD event and in the absence of feedback circuit 602, a portion of the potential at I/O pad 14 may inadvertently be coupled to the first voltage supply, VDD, via a parasitic conduction path. This conduction path effectively forms a negative feedback loop with respect to the trigger current generated by transistor 204. As a consequence, less of the injected current at I/O pad 14 appears at the control electrode of transistor 202. An example of such a path occurs when transistor 16 (FIG. 1) breaks down when extreme voltages are applied to I/O pad 14. These extreme voltages appear at the gate of transistor 204 in the absence of feedback circuit 602, reducing the source-to-gate voltage of transistor 204. A smaller source-to-gate voltage reduces the in trigger current provided to transistor 202. Feedback circuit 602 prevents the negative feedback loop, replacing it with a positive feedback loop. Feedback circuit 602 prevents this negative feedback loop where ever formed.

Continuing with FIG. 6, ESD circuit 600 is similar to the circuit depicted in FIG. 2. A first terminal of resistor 604 and a first current electrode of transistor 606 are coupled to the control electrode of transistor 204. A second terminal of resistor 604 is coupled to a first current electrode of transistor 608. A second current electrode and a control electrode of transistor 608 is coupled to the first voltage supply, VDD, and to the second voltage supply, VSS, respectively. A second current electrode and a control electrode of transistor 606 is coupled to the second voltage supply, VSS, and to a first terminal of resistor 610, respectively. A second terminal of resistor 610 is coupled to the second voltage supply, VSS. The control electrode of transistor 606 is also coupled to a first current electrode of transistor 612. A second current electrode and a control electrode of transistor 612 is coupled to the first current electrode of transistor 204, and to the first voltage supply, VDD, respectively. In transistors 204, 608, and 612 the well of each transistor is coupled to its respective source.

In the depicted second embodiment, MOSFET 204 and transistor 202 are an p-type MOSFET and a parasitic lateral bipolar transistor, respectively. In another second embodiment, MOSFET 204 and transistor 202 may be a p-type MOSFET and a bipolar transistor, respectively. Recall, a bipolar transistor contains a controllable or free control electrode.

H. Second embodiment of ESD circuit
2. Operation

In operation, ESD circuit 600 operates in a normal mode and provides ESD protection.

a. Normal Operation

In normal operation, ESD circuit 600 should remain in a non-conductive state so that it does not interfere with the voltage levels on I/O pad 14. En this case, transistor 608 pulls the control electrode of transistor 204 towards the voltage supply, VDD. A high voltage level on the control electrode of transistor 204 thereby places transistor 204 into a non-conductive state.

b. ESD Events

ESD circuit 600 provides ESD protection as described above in connection with FIGS. 1 and 2. Additionally, feedback circuit 602 ensures that transistor 204 is in a conductive state during an ESD event.

During an ESD event, a large positive voltage is applied to I/O pad 14 with respect to either the voltage supply, VDD, or the voltage supply, VSS. In the case of a large voltage input to I/O pad 14 with respect to VSS, transistor 612 and transistor 204 begin to conduct when the input voltage exceeds the sum of, approximately, (5*0.5) Volts, plus a threshold voltage level of transistor 612 (or transistor 204). Once conducting, transistor 612 causes a voltage to occur at the control electrode of transistor 606. When this voltage exceeds one threshold voltage above VSS, transistor 606 will couple the control electrode of transistor 204 to the voltage supply, VSS, maintaining transistor 204 in a conducting state. Resistor 604 allows transistor 606 to easily pull down the voltage at the control electrode of transistor 204. As described above transistor 204 will supply a trigger current to transistor 202. Feedback circuit 602 maintains transistor 204 in a conductive state even if voltage supply VDD begins to move sympathetically with I/O pad 14. Transistor 612 need only supply a very small current to resistor 610 such that the voltage across resistor 610 exceeds the threshold voltage of transistor 606. Transistor 606 thereby maintains transistor 204 in a fully conductive state.

In the case of a large input voltage to I/O pad 14 with respect to VDD, transistor 612 and transistor 204 begin to conduct when the input voltage exceeds the sum of, approximately, (5*0.5) Volts, plus a threshold voltage level of transistor 612 (or transistor 204). Once conducting, transistor 612 causes a voltage to occur at the control electrode of transistor 606. When this voltage exceeds one threshold voltage above VSS, transistor 606 will couple the control electrode of transistor 204 to the voltage supply, VSS, maintaining transistor 204 in a conducting state. As described above transistor 204 will supply a trigger current to transistor 202 . Transistor 202 shunts current to voltage supply, VDD, through voltage supply, VSS and diode 26.

The operation of ESD circuit 600 during an EOS event is similar to its operation in an ESD event. Here, transistor 204 begins supplying a trigger current to transistor 202 when the voltage of I/O pad 14 exceeds the sum of, approximately, (5*0.5) Volts, plus a threshold voltage level of transistor 612 (or transistor 204) plus the control electrode voltage of transistor 612 (VDD).

II. I/O Driver Circuit

H. Third embodiment of ESD circuit

Figure 7:
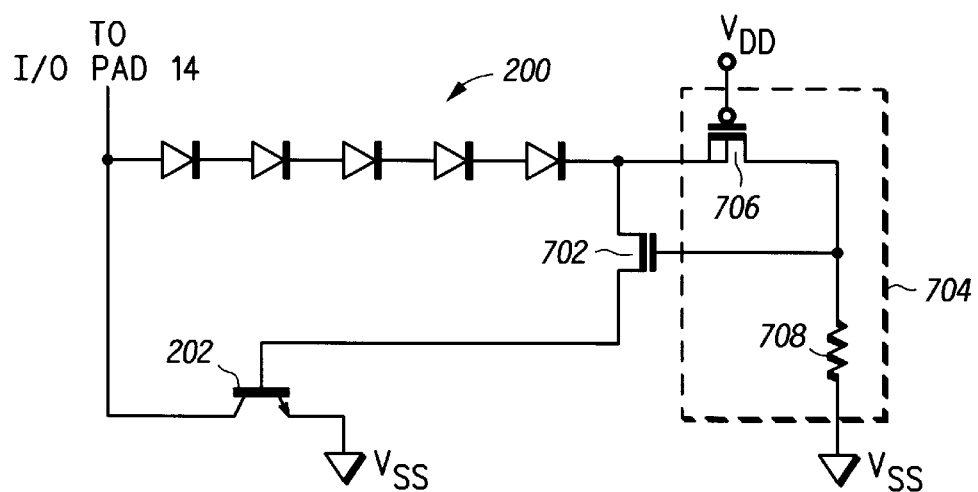
FIG. 7 depicts a circuit diagram of a third embodiment of the ESD circuit illustrated in FIG. 1.

FIG. 7 depicts a circuit diagram of a third embodiment 700 of the ESD circuit illustrated in FIG. 1 In the third embodiment of the present invention, p-type MOSFET 204 is replaced with an n-type MOSFET 702 and a biasing circuit 704 is coupled to the control electrode of the n-type MOSFET. An n-type MOSFET has an intrinsically higher transconductance than a p-type MOSFET. Consequently, a smaller MOSFET may be used to generate a desired trigger current.

1. Connectivity

Continuing with FIG. 79 a first current electrode and a second current electrode of MOSFET 702 is coupled to the second terminal of string of diodes 200 and to the control electrode of transistor 202, respectively. The second terminal of string of diodes 200 and the control electrode of MOSFET 702 are connected to biasing circuit 704. Specifically, the second terminal of string of diodes 200 and the control electrode of MOSFET 702 is connected to a first current electrode and to a second current electrode of a p-type MOSFET 706, respectively. A control electrode of MOSFET 706 is connected to the first voltage supply VDD. The second current electrode of MOSFET 706 is also connected to a first terminal of a resistor 708. A second terminal of resistor 708 is coupled to the second voltage supply VSS. The well of transistor 706 is coupled to its first current electrode.

In the depicted third embodiment, MOSFET 702 and transistor 202 are an n-type MOSFET and a parasitic lateral bipolar transistor, respectively. En another third embodiment, MOSFET 702 and transistor 202 may be an n-type MOSFET and a bipolar transistor, respectively. Recall, a bipolar transistor contains a controllable or free control electrode.

2. Operation a. Normal Operation

In normal operation, ESD circuit 700 should remain in a non-conductive state so that it does not interfere with the voltage levels on I/O pad 14. In this case, the first voltage supply VDD forces transistor 706 into a non-conductive state. Resistor 708 pulls the control electrode of transistor 702 and the floating second current electrode of transistor 706 towards the second voltage supply VSS. A low voltage level on the control electrode of transistor 702 thereby places transistor 702 into a non-conductive state.

b. ESD Events

ESD circuit 700 provides ESD protection as described above in connection with FIGS. 1 and 2. Additionally, bias circuit 704 ensures that transistor 702 is in a conductive state during an ESD event.

During an ESD event a large positive voltage is applied to I/O pad 14 with respect to either the first voltage supply VDD or the second voltage supply VSS. In the case of a large voltage input to I/O pad 14 with respect to VSS, transistor 706 begins to conduct when the input voltage exceeds the sum of, approximately, (5*0.5) Volts, plus a threshold voltage level of transistor 706. Once conducting, transistor 706 causes a voltage to occur at the control electrode of transistor 702. When this voltage exceeds one threshold voltage above VSS, transistor 702 will be in a conducting state. As described above transistor 702 will supply a trigger current to transistor 202. Bias circuit 704 places transistor 702 into a conductive state even if voltage supply VDD begins to move sympathetically with I/O pad 14. Transistor 706 need only supply a very small current to resistor 708 such that the voltage across resistor 708 exceeds the threshold voltage of transistor 702. Bias circuit 704 thereby places transistor 702 into a fully conductive state.

In the case of a large input voltage to I/O pad 14 with respect to VDD, transistor 706 begins to conduct when the input voltage exceeds the sum of, approximately, (5*0.5) Volts, plus a threshold voltage level of transistor 706. Once conducting, transistor 706 causes a voltage to occur at the control electrode of transistor 702. When this voltage exceeds one threshold voltage above VSS, transistor 702 will be in a conductive state. As described above transistor 204 will supply a trigger current to transistor 202. Transistor 202 shunts current to voltage supply, VDD, through voltage supply, VSS and diode 26.

The operation of ESD circuit 700 during an EOS event is similar to its operation in an ESD event. Here, transistor 702 begins supplying a trigger current to transistor 202 when the voltage of I/O pad 14 exceeds the sum of, approximately, (5*0.5) Volts plus a threshold voltage level of transistor 706 plus the control electrode voltage of transistor 706 (VDD).

III. Segmented Bus Architecture

A. Connectivity

Figure 8:
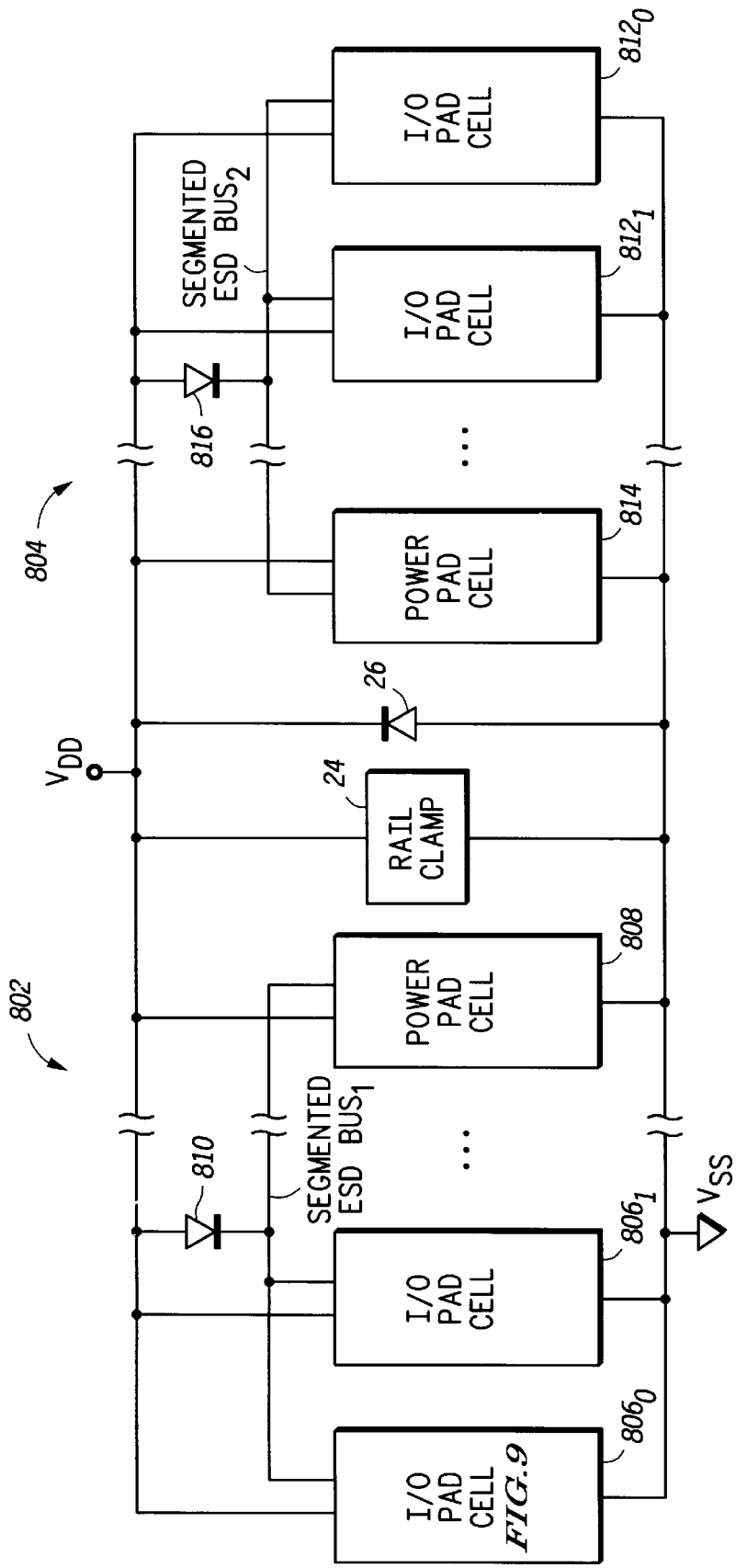
FIG. 8 depicts a block diagram of a segmented bus architecture for ESD protection.

FIG. 8 depicts a block diagram of a segmented bus architecture (SBA) 800 for ESD protection. SBA 800 removes certain ESD circuitry from each I/O (input, output, or I/O) pad cell and places it in a power pad cell or in some other unused area of the integrated circuit which incorporates SBA 800.

T Typically, a power pad cell can accommodate the ESD circuit because the power pad cell does not contain other circuitry. One skilled in the art will readily appreciate that the removed ESD circuitry might also be placed under another type of pad cell that contains available circuit area, such as a clock input pin. The removed ESD circuit is shared by several adjacent I/O pad cells via a segmented ESD bus. As a result, each individual I/O pad cell may be reduced in size.

Continuing with FIG. 8, SBA 800 contains a first grouping 802 and a second grouping 804 of I/O pad cells and power cells. Specifically, first grouping 802 comprises I/O pad cells $806_0$, $806_1$, etc., and a power pad cell 808. I/O pad cells $806_0$, $806_1$, etc., and power pad cell 808 are connected to each other via segmented $bus_1$, to the first voltage supply VDD, and to the second voltage supply VSS. (Power pad cell 808 is connected to the second voltage supply VSS via its internal ESD circuitry.) Segmented ESD $bus_1$ is also connected to the first voltage supply VDD by a diode 810. Diode 810 is connected to allow current to flow from the first voltage supply VDD to segmented ESD $bus_1$. Second grouping 804 comprises I/O pad cells $812_0$, $812_1$, etc., and a power pad cell 814. I/O pad cells $812_0$, $812_1$, etc., and power pad cell 814 are connected to each other via segmented $bus_2$, to the first voltage supply VDD, and to the second voltage supply VSS. (Power pad cell 814 is connected to the second voltage supply VSS via its internal ESD circuitry.) Segmented ESD bus2 is also connected the first voltage supply VDD by a diode 816. Diode 816 is connected to allow current to flow from the first voltage supply VDD to segmented ESD $bus_2$.

SBA 800 also includes a rail clamp 24 and a diode 26 connected in parallel between the first voltage supply VDD and the second voltage supply. Rail clamp 24 and diode 26 are described above in connection with FIG. 1.

I/O pad cells 806 and 808 are more fully described below in connection with FIG. 9. Power pad cells 808 and 814 include a pad for receiving a voltage supply and ESD circuitry. The ESD circuitry included in power pad cells 808 and 814 may be instantiated with any of the ESD circuits described above in FIGS. 29 69 and 7. Furthermore, the ESD circuitry instantiated in power pad cell 808 may include other circuitry known in the art which is electrically isolated from I/O) pad cells 806 and 812 during normal operation.

B. I/O Pad Cell

Figure 9:
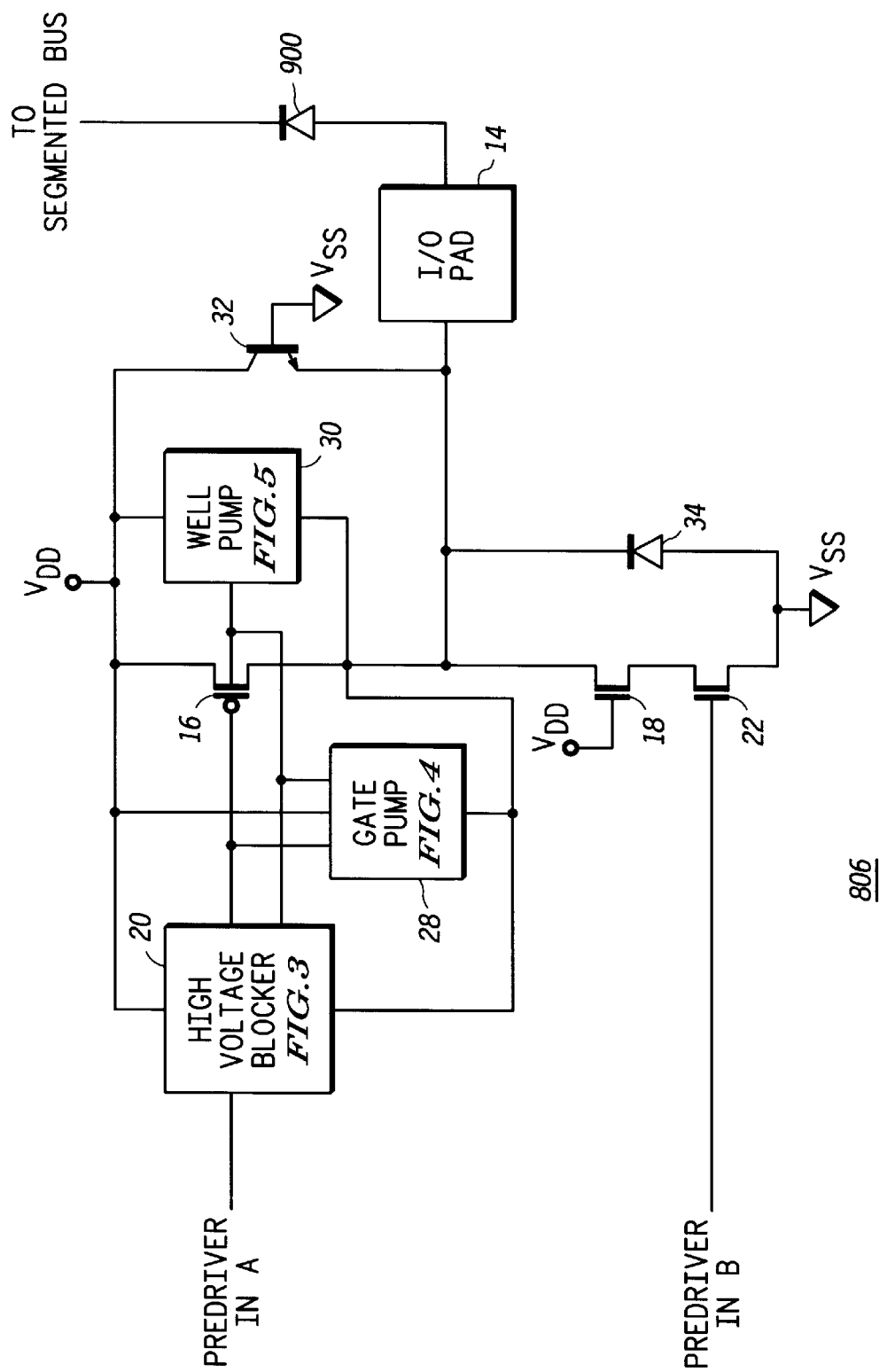
FIG. 9 depicts a depicts a partial block diagram partial schematic diagram of an input/output pad cell useful in the segmented bus architecture illustrated in FIG. 8.

FIG. 9 depicts a depicts a partial block diagram partial schematic diagram of an input/output (I/O) pad cell 806 useful in the segmented bus architecture illustrated in FIG. 8. I/O pad cell 806 is substantially similar to I/O driver circuit 10 depicted in FIG. 1. Here, a diode is serially connected between I/O pad 14 and the segmented ESD bus. Diode 900 allows current to flow from I/O pad 14 to the segmented ESD bus. Rail clamp 24 and diode 26 have been removed from I/O driver circuit 10 and are now shared by all power pad cells and I/O pad cells.

C. Operation
1. Normal Operation

Diodes 810 and 816 precharge the segmented ESD buses during normal operation. This precharging precludes external devices connected to I/O pad cells from seeing the capacitive load of the segmented ESD buses. Conversely, a diode (depicted in FIG. 9.) isolates the segmented ESD buses from the I/O pad cells. This third diode allows the I/O pad cells to output or receive a voltage level that is lower than or equal to VDD.

2. ESD Events a. Positive Voltage Input With Respect to VDD

In this case, a large positive voltage level with respect to voltage supply VDD is applied to an I/O pad within a particular one of the I/O pad cells. The large positive input current flows from the I/O pad cell via the segmented bus to the ESD circuit instantiated in the power pad cell. The ESD circuit in the power pad cell then shunts the current to the first voltage supply VDD via the second voltage supply VSS and diode 26 as described above in connection with FIG. 1.

b. Positive Voltage Input With Respect to VSS

In this case, a large positive voltage level with respect to voltage supply VSS is applied to an I/O pad within a particular one of the I/O pad cells. Again, the large positive input current flows from the I/O pad cell via the segmented bus to the ESD circuit instantiated in the power pad cell. The ESD circuit in the power pad cell then shunts the current to the second voltage supply VSS as described above in connection with FIG. 1.

c. Negative Input Voltage With Respect to VDD

Here, a large negative voltage level with respect to voltage level VDD is applied to an I/O pad within a particular one of the I/O pad cells. This large negative voltage is shunted through diode 34, second voltage supply VSS and rail clamp 24 to the first voltage supply VDD. There is also a secondary shunt path from the voltage supply VDD to I/O pad via transistor 32. In this secondary case, the inherent capacitance (or rail clamp 24) couples VDD to VSS and ultimately to the control electrode of transistor 32. Transistor 32 is then forward biased causing current to flow from the voltage supply VDD, through transistor 32, to the I/O pad.

d. Negative Voltage Input With Respect to VSS

In this case, a large negative voltage with respect to the second voltage supply VSS is applied to I/O pad within a particular one of the I/O pad cells. Here, diode 34 becomes forward biased, shunting energy from the voltage supply VSS to the I/O pad. There is also a secondary shunt path from the second voltage supply VSS to the I/O pad via transistor 32. In this secondary case, the control electrode-to-second current electrode junction of transistor 32 is forward biased, creating a direct current path from voltage supply VSS to the I/O pad. As depicted in FIG. 9, the voltage supply VSS is coupled to the control electrode of transistor 32.

Although the present invention has been described with reference to a specific embodiment, further modifications and improvements will occur to those skilled in the art. For instance, the disclosed invention is described with respect to a particular set of transistor conductivity types. One skilled, in the art, with the above description may change conductivity types under certain circumstances to tailor the invention to a particular process or embodiment. One skilled in the art may substitute other structures to accomplish the same purpose. It is to be understood therefore, that the invention encompasses all such modifications that do not depart from the spirit and scope of the invention as defined in the appended claims.

What is claimed is:

1. A circuit for electrostatic discharge protection, comprising:
   an input terminal;
   a first transistor comprising a first current electrode, a second current electrode, and a control electrode, wherein the first current electrode thereof is coupled to the input terminal;
   a feedback circuit coupled to the control electrode of the first transistor, the feedback circuit maintaining the first transistor in a conductive state during an electrostatic discharge event; and
   a parasitic bipolar device comprises a first current electrode, a second current electrode, and a control electrode, wherein the first current electrode is coupled to the input terminal, the second current electrode receives a second voltage supply, and the control electrode is coupled to the second current electrode of the first transistor; and
   a diode string further comprising at least one diode comprising a first terminal and a second terminal, wherein the first terminal is coupled to the input terminal and the second terminal is coupled to the first current electrode of the first transistor.

2. The circuit in claim 1, wherein the feedback circuit maintains the first transistor in a non-conductive state during normal operation.

3. The circuit in claim 2, wherein the feedback circuit further comprises:
   a second transistor comprising a first current electrode, a second current electrode and a control electrode, the first current electrode thereof coupled to the first current electrode of the first transistor, the control electrode thereof receiving a first voltage supply;
   a third transistor comprising a first current electrode, a second current electrode and a control electrode, the first current electrode thereof coupled to the control electrode of the first transistor, the control electrode thereof coupled to the second current electrode of the second transistor, the second current electrode thereof receiving the second voltage supply; and a first resistor comprising a first terminal and a second terminal, the first terminal thereof coupled to the control electrode of the third transistor, the second terminal thereof coupled to the second current electrode of the third transistor.

4. The circuit in claim 3, wherein the feedback circuit further comprises:

a second resistor comprising a first terminal and a second terminal, the second terminal thereof coupled to the control electrode of the first transistor.

5. The circuit in claim 4, wherein the feedback circuit further comprises:

a fourth transistor comprising a first current electrode, a second current electrode and a control electrode, the first current electrode thereof receiving the first voltage supply, the second current electrode thereof coupled to the first terminal of the second resistor, the control electrode thereof receiving the second voltage supply.

6. The circuit in claim 1, wherein the feedback circuit maintains the first transistor in a non-conductive state during normal operation.

7. The circuit in claim 6, wherein the feedback circuit further comprises:

a second transistor comprising a first current electrode, a second current electrode and a control electrode, the first current electrode thereof coupled to the first current electrode of the first transistor, the control electrode thereof receiving a first voltage supply;

a third transistor comprising a first current electrode, a second current electrode and a control electrode, the first current electrode thereof coupled to the control electrode of the first transistor, the control electrode thereof coupled to the second current electrode of the second transistor, the second current electrode thereof receiving the second voltage supply; and a first resistor comprising a first terminal and a second terminal, the first terminal thereof coupled to the control electrode of the third transistor, the second terminal thereof coupled to the second current electrode of the third transistor.

8. The circuit in claim 7, wherein the feedback circuit further comprises:

a second resistor comprising a first terminal and a second terminal, the second terminal thereof coupled to the control electrode of the first transistor.

9. The circuit in claim 8, wherein the feedback circuit further comprises:

a fourth transistor comprising a first current electrode, a second current electrode and a control electrode, the first current electrode thereof receiving the first voltage supply, the second current electrode thereof coupled to the first terminal of the second resistor, the control electrode thereof receiving the second voltage supply.

10. The circuit in claim 1, wherein the feedback circuit further comprises:

a second transistor comprising a first current electrode, a second current electrode and a control electrode, the first current electrode thereof coupled to the first current electrode of the first transistor, the control electrode thereof receiving a first voltage supply;

a third transistor comprising a first current electrode, a second current electrode and a control electrode, the first current electrode thereof coupled to the control electrode of the first transistor, the control electrode thereof coupled to the second current electrode of the second transistor, the second current electrode thereof receiving the second voltage supply; and a first resistor comprising a first terminal and a second terminal, the first terminal thereof coupled to the control electrode of the third transistor, the second terminal thereof coupled to the second current electrode of the third transistor.

11. The circuit in claim 10, wherein the feedback circuit further comprises:

a second resistor comprising a first terminal and a second terminal, the second terminal thereof coupled to the control electrode of the first transistor.

12. The circuit in claim 11, wherein the feedback circuit further comprises:

a fourth transistor comprising a first current electrode, a second current electrode and a control electrode, the first current electrode thereof receiving the first voltage supply, the second current electrode thereof coupled to the first terminal of the second resistor, the control electrode thereof receiving the second voltage supply.

13. A circuit for electrostatic discharge protection, comprising:

an input terminal;

a first transistor comprising a first current electrode, a second current electrode, and a control electrode, wherein the first current electrode thereof is responsive to the input terminal and the control electrode thereof receives a first voltage supply;

a feedback circuit directly connected to the first transistor and adapted to place the first transistor in a conducting state during an electrostatic discharge event; and a bipolar device comprising a first current electrode, a second current electrode, and a control electrode, wherein the first current electrode is directly connected to the input terminal, the second current electrode receives a second voltage supply, and the control electrode is directly connected to the second current electrode of the first transistor.

14. The circuit in claim 13, further comprising:

a diode string further comprising at least one diode comprising a first terminal and a second terminal, wherein the first terminal is coupled to the input terminal and the second terminal is coupled to the first current electrode of the first transistor.

15. The circuit in claim 14, wherein the feedback circuit places the first transistor in a non-conductive state during normal operation.

16. The circuit in claim 13, wherein the feedback circuit places the first transistor in a non-conductive state during normal operation.

* * * * *